(12) United States Patent
Masuda

(10) Patent No.: US 6,518,781 B2
(45) Date of Patent: Feb. 11, 2003

(54) PROBE STRUCTURE AND MANUFACTURING METHOD THEREOF

(75) Inventor: Kenichi Masuda, Yamanashi (JP)

(73) Assignee: Hoya Corporation, Tokyo (JP)

( * ) Notice: Subject to any disclaimer, the term of this patent is extended or adjusted under 35 U.S.C. 154(b) by 146 days.

(21) Appl. No.: 09/748,021

(22) Filed: Dec. 27, 2000

(65) Prior Publication Data
US 2002/0008535 A1 Jan. 24, 2002

(30) Foreign Application Priority Data
Dec. 27, 1999 (JP) .......................................... 11-370169

(51) Int. Cl.[7] .............................................. G01R 1/073
(52) U.S. Cl. ...................................... 324/757; 324/754
(58) Field of Search ................................. 324/757, 754, 324/755, 765; 257/48, 739; 438/15, 17

(56) References Cited

U.S. PATENT DOCUMENTS

| 5,487,999 A | * | 1/1996 | Farnworth | 216/18 |
|---|---|---|---|---|
| 5,642,055 A | * | 6/1997 | Difrancesco | 174/261 |
| 5,756,370 A | * | 5/1998 | Farnworth et al. | 438/117 |
| 5,973,405 A | * | 10/1999 | Keukelaar et al. | 257/48 |
| 6,344,753 B1 | * | 2/2002 | Takada et al. | 324/754 |

FOREIGN PATENT DOCUMENTS

| JP | 06-27141 | 2/1994 |
| JP | 09-133711 | 5/1997 |

* cited by examiner

*Primary Examiner*—Ernest Karlsen
(74) *Attorney, Agent, or Firm*—Sughrue Mion, PLLC

(57) ABSTRACT

In a probe structure which has a bump contact protruded from one surface of an insulating substrate, the bump contact is deposited such that a surface roughness falls within a predetermined range specified by Rmax within a range from 0.01 to 0.8 μm, Ra within a range from 0.001 to 0.4 μm, and a ratio of Rmax/Ra within a range from 2 to 10. Such a surface roughness is realized by depositing a convex/concave layer formed by aggregation of fine grains. The convex/concave layer is directly deposited to a basic shape portion without any intermediate layer left between the convex/concave layer and the basic shape portion.

2 Claims, 5 Drawing Sheets

20.0 μm 1.00 μm

PROBE STRUCTURE AND MANUFACTURING METHOD THEREOF

BACKGROUND OF THE INVENTION

1. Field of the Invention

The present invention relates to a probe structure for testing a device-under-test (DUT), such as a semiconductor device, by a burn-in test or the like, and also to a method of manufacturing the probe structure. It is to be noted throughout the instant specification that the probe structure is electrically contacted with a contact object, such as an electrode pad or a circuit pattern, which is formed on the DUT and which may be simply called an electrode.

2. Description of the Related Art

In a conventional probe structure, a hemispherically projecting bump contact is formed as a contact point for contacting with the electrode formed on the DUT, such as a semiconductor device.

As a bump contact having the conventional bump structure, it is known in the art that fine projections are intentionally formed on a surface of the bump contact so as to improve reliability of contact with the electrode (for example, Japanese Unexamined Patent Publication (A) No. H06-27141, namely, 27141/1994). By forming fine projections on the surface of the bump contact, the contact area of the bump contact with the electrode becomes large and this enables a reliable contact with the electrode. Even when an oxide film is formed on the surface of the contact object, namely, the electrode, the fine projections can break the oxide film, and give a stable contact resistance.

Another probe structure has been disclosed in Japanese Unexamined Patent Publication (A) No. H09-133711 (133711/1997) and has a structure similar to that shown in FIG. 1. Specifically, a bump contact 2 illustrated in FIG. 1 is protruded from one side or one principal surface of an insulating substrate 1. The bump contact 2 is electrically connected through a conductive portion 4 to an electrode 3 which is operable as a part of an electric circuit provided on the other side, namely, another principal surface of the insulating substrate. The bump contact 2 has a basic shape portion 2a (an inside layer), of nickel, and an intermediate layer of plated gold on a surface of the basic shape portion 2a. In addition, a surface layer 2c and fine projections 2d each of which is formed by rhodium are deposited on the surface of this intermediate layer. The surface layer 2c and the fine projections 2d may preferably be formed by the same material (rhodium) deposited by plating. The fine projections 2d are formed by controlling plating current so as to be locally protruded from the surface layer 2c. With this structure, the surface layer 2c and the fine projections 2d are combined together to form an integrated material structure without a boundary between them. As a result, the above-mentioned publication reports that fine projections are obtained which hardly come off and which are practically kept constant in configuration.

However, no disclosure is made at all in the above-referenced publications about sizes and surface roughness of the fine projections formed on the surface of the conventional bump contact. From this fact, it is difficult from the publications to know about appropriate ranges for the surface roughness specified by Rmax and Ra, a ratio of Rmax/Ra, and about a projection pitch or spacing, the projection shape including the thickness, the projection density and other configuration of projections. As a result, forming conditions are liable to fall outside of an acceptable range and to give rise to undesirable shapes of the projections. Since the forming method itself of projections makes it difficult to avoid a variation of the projection shape, the projection shape often falls outside the acceptable range. A projection shape formed outside the acceptable range results in inconveniences, such as breakaway of projections and a variation of contact resistance.

Alternatively, a method is also disclosed in Japanese Unexamined Patent Publication (A) No. H09-133711 (133711/1997) to manufacture a bump contact. The bump contact actually manufactured by the method is disadvantageous in that adhesion of the surface layer 2c and the projections 2d is weak and the projection shape or configuration is variable. This is also similar to the case where no intermediate layer 2b of plated gold is interposed between the surface layer 2c of rhodium and the projections 2d of rhodium and, as a result, the surface layer 2c and the projections 2d are formed directly on the surface of the basic shape portion 2a.

Practically, it is confirmed that the surface layer 2c and the projections 2d of rhodium in the bump contact manufactured by the method disclosed in the aforementioned Publication have easily peeled off in a tape peeling test. This shows a low adhesion of the projections.

In the bump contact prepared by the method described in the above-publication, as projections become high, they become thinner in some cases. This easily comes off the bump surface through repetition of contact between the bump contact and the contact object, and this brings about a variation in contact resistance.

Heretofore, it is difficult to deposit the fine projections always to a constant height (a constant surface roughness) and to keep a variation of surface roughness and a projection density invariable. This sometimes results in a variation of the contact resistance between different bumps. If the contact resistance is varied among bumps, inconvenience is liable to occur on transmitting electric signals between the probe structure and the DUT. This makes it difficult to obtain accurate and reliable measurement results due to the variation of the contact resistance among the bumps. Very high contact resistance makes it difficult to transmit and receive electric signals between the probe structure and the DUT.

As a result of searching for causes of the above circumstances, it has been ascertained that presence of an inert layer under the projecting portions brings about a poor adhesion of the projecting portions, and that presence of the inert layer gives rise to a variation of the projection shape. It has also been found out that a change in current density during plating adversely affects stability of current density and also deforms the projection shape.

Provision of an intermediate layer of gold or the like under the projecting portion has been also found to lead to a poorer adhesion of the projecting portion. Provision of such an intermediate layer has a problem of a more complicated manufacturing process.

SUMMARY OF THE INVENTION

Accordingly, it is an object of the present invention to provide a probe structure which is capable of making a configuration or shape of projections uniform within a predetermined range and which therefore has excellent properties.

It is another object of the present invention to provide a method of manufacturing a probe structure which has projections with a comparatively uniform configuration.

Another object of the invention is to provide a probe structure which has projections of a good adhesion, excellent bump contacts in strength and which rarely causes breakage to occur even after repetition of contact. The probe structure can keep contact resistance substantially constant among individual bump contacts and is easy to manufacture.

The probe structure and the manufacturing method thereof of the invention have the following configurations.

(Configuration 1)

A probe structure which comprises an insulating substrate having first and second principal surfaces, a bump contact protruded from the first principal surface, and an electrode electrically connected to the bump contact and operable as a part of an electrical circuit formed on the second principal surface and/or an inner side of the insulating substrate, wherein the bump contact has a surface roughness which is specified by Rmax within a range from 0.01 to 0.8 μm, Ra within a range from 0.001 to 0.4 μm, and a ratio of Rmax/Ra within a range from 2 to 10.

(Configuration 2)

A probe structure according to configuration 1, wherein the bump contact has, on its surface, a plurality of projections which define the surface roughness and which have a projection spacing within a range from 0.1 to 0.8 μm, and a projection thickness which is not smaller than one third of the projection spacing.

(Configuration 3)

A probe structure which comprises an insulating substrate having first and second principal surfaces, a bump contact protruded from the first principal surface, and an electrode electrically connected to the bump contact and operable as a part of an electrical circuit formed on the second principal surface and/or an inner side of the insulating substrate, wherein the bump contact has, at least on its surface, a convex/concave layer formed by an aggregation of fine grains.

(Configuration 4)

A probe structure according to configuration 3, wherein the bump contact comprises a basic shape portion of a single layer having a base surface; the convex/concave layer being formed directly on the base surface of the basic shape portion to provide the surface of the bump contact.

(Configuration 5)

A probe structure according to configuration 3, wherein the bump contact has a surface roughness which is defined by Rmax within a range from 0.01 to 0.8 μm, Ra within a range from 0.001 to 0.4 μm, and a ration of Rmax/Ra within a range from 2 to 10.

(Configuration 6)

A probe structure according to configuration 3, wherein the fine grains have a grain size within a range from 5 to 200 nm.

(Configuration 7)

A probe structure according to configuration 3, wherein the convex/concave layer on the base surface has a hardness within a range from 800 to 1,000 Hk (Knoop hardness).

(Configuration 8)

A probe structure according to configuration 4, wherein the basic shape portion has a smooth hemispherical projection shape and a hardness within a range from at least 100 Hk to up to 800 Hk.

(Configuration 9)

A method of manufacturing a probe structure, comprising the steps of providing a basic shape portion of a bump contact on one principal surface of an insulating substrate; providing an electrode forming at least a part of an electric circuit on the other principal surface of the insulating substrate and/or in the inside thereof; electrically connecting the basic shape portion of the bump contact to the electrode forming a part of the electrical circuit; and carrying out mat plating without substantially exposing the base surface of the basic shape portion to an atmosphere.

(Configuration 10)

A method according to configuration 9, further comprising the step of forming an oxidation preventing layer for preventing oxidation of the basic shape portion, prior to the step of carrying out the mat-plating the base surface of the basic shape portion.

(Configuration 11)

A method according to configuration 10, wherein the oxidation preventing layer has a thickness within a range from 0.001 to 0.05 μm.

(Configuration 12)

A method according to configuration 9, wherein the mat plating is carried out under a current density within a range from 0.1 to 1.0 A/dm$^2$ with the current density kept invariable.

(Configuration 13)

A method according to configuration 9, wherein the material for the mat plating is rhodium.

(Configuration 14)

A probe structure according to configuration 4, wherein the bump contact has a bump which is formed by the basic shape portion of nickel alone or a nickel alloy, and a mat-rhodium-plated layer on the base surface of the basic shape portion without any inert layer interposed between the basic shape portion and the mat-rhodium-plated layer the probe structure being used for a burn-in test.

(Configuration 15)

A probe structure according to configuration 4, wherein the bump contact has a bump formed by the basic shape portion of nickel alone or a nickel alloy and both a gold strike plating layer and a mat rhodium plating layer on the base surface of the basic shape portion; the probe structure being used for a burn-in test.

According to configuration 1, by using a surface roughness of the bump contact specified by Rmax within a range from 0.01 to 0.8 μm, Ra within a range from 0.001 to 0.4 μm, and a ratio of Rmax/Ra within a range from 2 to 10, it is possible to achieve an excellent durability against repeated contact with the device-under-test (DUT) and maintain a stable contact resistance.

Herein, Rmax and Ra are defined by the Japanese Industrial Standard (JIS B0601). Specifically, Rmax is the above-mentioned maximum height (the distance from a highest peak to a lowest valley while Ra is the above-mentioned center-line-mean roughness (the average of an absolute value of a deviation from a center line of a roughness curve to the roughness curve).

When the contact object is an aluminum electrode, an oxide film is usually formed into a thickness within a range from 0.01 to 0.1 μm. A substantial roughness in a roughened state is preferably defined by an Rmax within a range of from 0.01 to 0.8 μm and an Ra within a range of from 0.001 to 0.4 μm. This is because the defined roughness and the thickness on this level are sufficiently enough to break the oxide film and to avoid damages of the electrode as a whole. A surface roughness represented by Rmax less than 0.01 μm and Ra less than 0.001 μm gives only an insufficient effect of breaking the oxide film of a metal on the contact object even when the surface is brought into contact with the object. With a surface roughness represented by Rmax over 0.8 μm and Ra over 0.4 μm, in contrast, even the aluminum film pad is broken by the probe structure and the electrode as the contact object is damaged. Furthermore, as the surface roughness is larger, upon pressing the bump contact against the contact object, the metal of the contact object is adhered to surface grooves formed among the projections and is left there. Under the circumstances, the surface roughness is preferably specified by Rmax within a range from 0.1 to 0.5 μm and Ra within a range from 0.05 to 0.25 μm.

A ratio of the above-mentioned Rmax to Ra (Rmax/Ra) exceeds 10 and then causes an undesirable state to occur because the surface roughness is widely varied. Specifically, undesirably high projections often appear and are weak in strength. Thus, such projections are poor in durability. A ratio of Rmax/Ra becomes smaller than 2, which results in a smaller variation of the surface roughness, but this is hardly achievable in terms of manufacture. The ratio Rmax/Ra should therefore preferably be at least 2.

Even when the surface oxide film causes no problem, Rmax, Ra and Rmax/Ra should preferably be within the aforementioned ranges because a large contact area is available, with a lower contact resistance, and a stable contact is achieved.

According to configuration 2, the projection spacing (distance between projections associated with contact) is within a range of from 0.1 to 0.8 μm. The projection has a shape of a pitch or spacing that does not exceed Rmax. The projection thickness (thickness at ½ height) is at least ⅓ the projection spacing. By satisfying these conditions, it is possible to achieve an excellent durability against repetition of contact with the contact object, and to maintain a stable contact resistance. The term "projection pitch" or "projection spacing" as used herein means the distance between centers of projections associated with contact. The projection center may be either an apex of each projection or a size center of a size determined by a bottom contour of the projection.

Herein, the projection thickness is defined with reference to FIG. 2. A single projection is assumed to be observed on the surface condition of a bump contact by the use of a scanning electron microscope (SEM). In this event, the projection thickness is defined by a size measured at a half height of the projection. Specifically, a curve of the half height is drawn as a dotted line in FIG. 2 by plotting middle or half points between an apex or center of the projection to be contacted and a bottom contour of the projection.

As mentioned in conjunction with configuration 3, when a convex/concave layer (projections) is formed by aggregating fine grains on the surface of the bump contact, a maximum height of each aggregation of fine grains is used as the apex of the projections associated with contact. The bottom of each aggregation of the fine grains is used as the projection bottom when the projection thickness is determined.

At any rate, a high projection density can be obtained by providing one or more projections per μm². By obtaining a high projection density, a wider contact area is available upon contact with the DUT, and this makes it possible to obtain a stable contact resistance. The projection density should preferably be within a range from at least 1 to up to 50 per μm², or more preferably, from at least 1 to up to 30 per μm², or still more preferably, from at least 1 to up to 10 per μm². The projection herein used means a projection associated with contact, and in the case of a convex/concave layer (projection) formed by the aggregations of fine grains as in configuration 3, each aggregation of fine grains is deemed to be a single projection. An excessively high projection density should be avoided because it leads to a smaller projection thickness and a poorer durability of the projection.

According to configuration 3, aggregations of fine grains permits formation of a dense film. Such a dense film can increase an area adhered to the basic shape portion and can form a stable convex/concave layer having a high projection density. Even when the apex portion of the projection itself is large in size, exposure of fine grains on the surface makes it possible to easily break the oxide film of the contact object.

The convex/concave layer comprising the aggregations of fine grains is formed on the surface of the bump contact without intermediary of an inert layer. This is favorable because it is possible to avoid a decrease in adhesion of the projection or variation of the projection shape caused by the presence of an inert layer.

When the convex/concave layer is formed by using a strongly acidic plating solution on rhodium, an inconvenience may sometimes be caused by oxidation of the surface of the basic shape portion, a poorer adhesion, or non-uniform growth of the film (occurrence of variation of the projection shape). In such a case, the inconvenience can be avoided by providing an oxidation preventing layer for preventing oxidation of the basic shape portion as described in configuration 10.

A convex/concave layer comprising the aggregations of fine grains may be formed on the surface of an electrode and the like which are operable as a part of an electric circuit provided on the other side, namely, the second principal surface of the insulating substrate. The fine grains on the surface of the bump contact may be formed at random, or in conformity to a rule.

According to configuration 4, the aforementioned bump contact comprises a basic shape portion of a single layer, and a convex/concave layer formed directly on the surface of the basic shape portion. As a result, it is possible to avoid deterioration of adhesion of the projecting portions caused by presence of an intermediate layer of gold or the like under the projecting portions, and to easily manufacture the projecting portions because of absence of an intermediate layer.

A preferable bump structure in the probe structure of the present invention is such that the bump contact comprises the basic shape portion and the convex/concave layer having a surface roughness brought about by mat plating described later.

For the necessity to provide a hardness of the mat-plated surface sufficient to withstand repetition of contact with the contact object on the DUT, the hardness should preferably be within a range of from at least 800 to up to 1,000 Hk.

According to configuration 5, the bump contact has a surface roughness given by Rmax within a range from 0.01 to 0.8 μm, Ra within a range from 0.001 to 0.4 μm and Rmax/Ra within a range from 2 to 10. As a result, advantages similar to those of configuration 1 are available in addition to those of configurations 3 and 4. The more preferable range of surface roughness of the bump contact is the same as in configuration 1.

Advantages similar to those of configuration 2 are additionally accomplished by satisfying the requirements of configuration 2 in addition to those of configuration 5.

According to configuration 6, the size of the fine grains within a range of from 5 to 200 nm ensures availability of the advantages of configuration 3.

The grain size should preferably be within a range of from 5 to 100 nm, or more preferably, from 10 to 50 nm.

The size of the grain aggregation (projection) formed through aggregation of fine grains should preferably be within a range of from 0.02 to 1 μm, or more preferably, from 0.1 to 0.4 μm.

As described as to configuration 7, the hardness of the convex/concave layer which is the surface layer should preferably be within a range of from 800 to 1,000 Hk.

With a hardness under 800 Hk, the surface convex/concave layer can easily break an oxidation film upon contact with the contact object, and with a hardness over 1000 Hk, cracks tend to occur.

The surface convex/concave layer is roughened, and should be resistant to a damage caused by repeated contact with the contact object. The convex/concave layer is therefore required to have a hardness higher than the contact object. By imparting corrosion resistance and controllability of transfer and diffusion of the other metals from the contact object, the contact resistance can be preferably reduced.

When a precious metal is used for the surface convex/concave layer, the precious metal may be a single metal or an alloy thereof. In order to avoid an increase in contact resistance resulting from diffusion of a base metal throughout the entire surface and oxidation, an increase in internal stress caused by organic impurities, and occurrence of cracks, the content of the precious metal should preferably be at least 99%. In the case of an alloy, a typical example is a combination of corrosion-resistant precious metals hardly diffusing such as rhodium and ruthenium.

According to configuration 8, a hardness of the basic shape portion under 100 Hk leads to easy deformation when the bump contact is brought into contact with, and pressed against, the contact object. A hardness over 800 Hk tends to cause easy occurrence of cracks.

The material forming the basic shape portion should preferably have crystallographic compatibility with the material of the electrode forming a part of the electric or conduction circuit (electrode electrically connected to the bump contact). In addition, the material should also have good adhesion and hardly diffusion characteristics. For example, when the material for the electrode forming a part of the electric circuit is copper, a preferable combination for the material for the corresponding basic shape portion is nickel or a nickel alloy.

The basic shape portion should preferably have a smooth hemispherically projecting shape.

According to configuration 9, a bump contact having a strong adhesion to the basis shape portion and a surface roughness (convex/concave layer) is obtained by carrying out mat plating without substantially exposing the surface of the basic shape portion to an atmosphere (for example, by continuously carrying out plating).

The process of applying mat plating to the surface layer without substantially exposing the basis shape portion to the atmosphere is, for example, a process of preventing the bump contact from contacting with the atmosphere during a predetermined period. The predetermined period lasts from forming the basic shape portion by plating up to application of mat plating to the surface layer. More specifically, the process comprises the steps of setting an insulating substrate on a jig, putting the same in a plating vessel, forming a basic shape portion by plating, then, rinsing off the plating solution, used for forming the basic shape portion, adhering to the plating jig while taking out the jig from the plating vessel for the next step of surface layer plating, and continuously spraying pure water onto the bump contact prior to mat plating of the surface layer and before and after the treatment so that a water film always covers the bump contact. Thus, the bump contact is prevented from being in contact with the atmosphere during the period from the end of forming of the basic shape portion through entrance thereof in the plating solution for mat plating. The bump contact is not allowed to come into contact with the atmosphere not only by means of the water film, but also during the step of surface activation of the basic shape portion through a sulfate treatment. When two kinds of plating are carried out in succession in the same vessel, as well, pure water is always continuously sprayed onto the bump contact during rising of the plating solution, the plating pretreatment, and rinsing, so as to prevent the bump contact from coming into contact with the atmosphere.

The mat plating means a plating which is effective to achieve a surface condition in which the surface is not glossy and not smooth, and has a property of diffused reflection rather than mirror surface reflection.

When the bump contact of the basic shape portion is exposed to the atmosphere prior to forming a surface layer plating film, the surface of the contact is in inert state, and this deteriorates adhesion with the surface layer plating formed in the following step. This inert condition of the contact surface is considerable particularly when using nickel or a nickel alloy, and activation through a pretreatment is difficult.

By applying mat plating without exposing the surface of the basic shape portion to the atmosphere, strong adhesion between the different materials is ensured, and this gives a plating film which hardly comes off even after repeated contact with the contact object.

In order to prevent the surface of the basic shape portion from being exposed to the atmosphere, as in configuration 10, an oxidation preventing layer for preventing oxidation of the basic shape portion may be formed prior to mat plating. When the oxidation preventing layer is thick, a decrease in adhesion of the projection or variation of the projection shape would be produced. The thickness should therefore be the smallest possible. As in configuration 11, the thickness of the oxidation preventing film should preferably be within a range of from 0.001 to 0.05 μm. Methods of forming an oxidation preventing film having a thickness of this order include stroke plating. The material for the oxidation preventing film should be gold, silver or palladium.

Particularly, when the material for the convex/concave layer is rhodium formed with a strongly acidic plating solution, the surface of the basic shape portion may be oxidized, adhesion may be deteriorated, or the film growth may become non-uniform (variation of the projection shape may be produced), even if the surface is not substantially exposed to the atmosphere. Formation of the oxidation preventing film is therefore effective.0

According to configuration 12, by forming the surface convex/concave layer with a relatively low plating current density (specifically, within a range of from 0.1 to 1.0 A/dm$^2$), it becomes easier to control the surface roughness condition. Even when providing a plurality of bump contacts on a substrate, therefore, it is possible to make the surface condition of each bump contact closer to a uniform state, and reduce variation of contact condition between the contact object and each bump contact.

By always keeping a current density of mat plating constant, the current density is stabilized, and variation of the projection shape is never produced.

By varying the current density, the amount of polishing agent, and the plating material in the plating step, furthermore, it is possible to control the surface roughness condition and the projection density, and achieve a surface roughness suitable to break through the oxide film of the electrode section.

According to configuration 13, rhodium used as the material for mat plating gives strong adhesion, and makes it difficult for the plating film to come off even after repeated contact with the contact object. By varying the current density, the amount of polishing agent, and the plating material in the plating step, it is possible to accurately control the surface roughness condition and the projection density.

According to configuration 14, contact resistance can be kept low from the initial stage of contact, and also can be maintained at a low level even upon the lapse of a period of time in a heated state. This is very effective when a burn-in test is carried out, in addition to the advantages described as to configurations 1 to 8. In this case, a bump is subjected to mat rhodium plating on the surface of the basic shape portion of nickel alone or a nickel alloy. No inert layer is deposited in the bump.

Similarly, as in configuration 15, by having a bump subjected to gold strike plating and mat rhodium plating on the surface of the basic shape portion of nickel alone or a nickel alloy, contact resistance is low from the initial stage of contact, and contact resistance can be maintained at a low level even upon the lapse of a period of time even in a heated state. This is effective on carrying out the burn-in test, in addition to the advantages described as to configurations as to configurations 1 to 8. For the purpose of simplifying the manufacturing process, configuration 14 is preferable. However, on using a strongly acidic plating solution such as that in mat rhodium plating, it is possible to ensure prevention of oxidation of the surface of the surface layer of nickel alone or a nickel alloy, and avoidance of a decrease in adhesion of the projections or variation of the projection shape. This results in an improved reliability.

According to the present invention, it is possible to limit the variation in contact resistance to up to 1 Ω after contacts are repeated 300 times.

DESCRIPTION OF THE PREFERRED EMBODIMENTS

The probe structure and the manufacturing method thereof of the present invention will now be described in detail.

Figure 3:
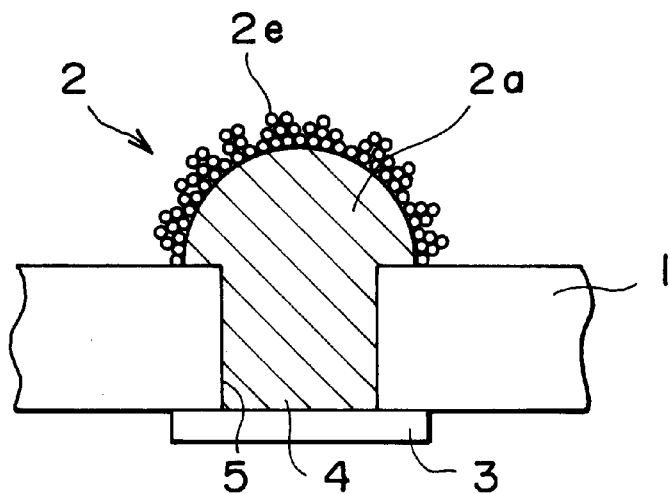
FIG. 3 is a partial sectional view for describing the probe structure of an embodiment of the present invention.
Figure 4:
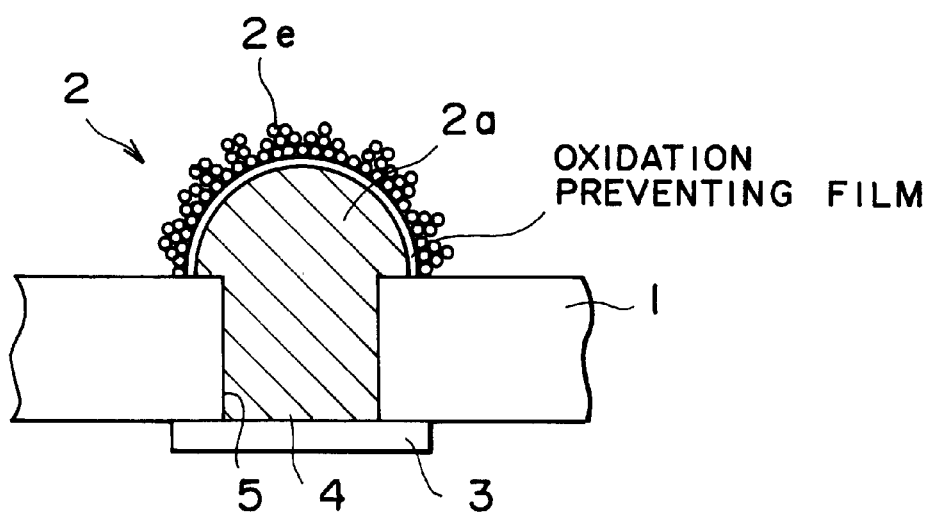
FIG. 4 is a partial sectional view for describing the probe structure of another embodiment of the invention.

FIG. 3 is a sectional view schematically illustrating the probe structure, together with the manufacturing method thereof. In the probe structure shown in FIG. 3, a bump contact 2 is provided on one side, namely, a first principal surface of an insulating substrate 1. On the other hand, an electrode 3 which is operable as a part of an electric or conduction circuit is provided on the other side, namely, a second principal surface of the insulating substrate 1. A throughhole 5 is formed in the insulating substrate 1. The bump contact 2 and the electrode 3 operable as the part of the electric circuit are arranged on opposite sides or principal surfaces of the insulating substrate and are electrically connected to each other via a conduction circuit 4 formed by a conductive material placed within the throughhole 5. The bump 2 comprises a hemispherical basic shape portion 2a and a surface layer 2e having a roughened surface. In the example shown in FIG. 3, the basic shape portion has a single-layer structure, and a surface layer 2e roughened by mat plating is formed on the surface of the basic shape portion 2a. In the example shown in FIG. 4, an oxidation preventing layer is formed on the surface of the basic shape portion 2a to form a multi-layer structure, and a surface layer 2e roughened by mat plating is formed on the surface of the oxidation preventing layer. The surface layer 2e roughened by mat plating is formed through aggregations of randomly formed fine grains.

The insulating substrate is not limited to a particular one so far as it is formed by an electrical insulator, but should preferably be flexible as well. Specifically, it may be selected from the group consisting of polyimide resins, polyester resins, epoxy resins, urethane resins, polystyrene resins, polyethylene resins, polyamide resins, ABS resins, polycarbonate resins and silicone resins, irrespective of either thermosetting or thermoplastic resins, according to the purpose of use. Among these resins, a polyimide resin excellent in heat resistance and chemical resistance and displaying a high mechanical strength is preferable. A thickness may be arbitrarily selected for the insulating substrate. In order to achieve sufficient mechanical strength and flexibility, however, the thickness should usually be within a range from 2 to 500 μm, or preferably, from 10 to 150 μm. As a probe structure used in a burn-in board or a probe card, an insulating resin film having a thickness of about 10 to 50 μm is preferable.

The electrode forming a part of the electric circuit is formed at a position corresponding to the interior point or the back of the position where a bump contact is to be formed in the insulating substrate. The electrode is electrically connected to the bump contact. The electric circuit comprises, apart from a circuit pattern formed of conductors and semiconductors, component elements forming the circuit such as contacts, coils, resistors and condensers. The electric or conduction circuit may be formed externally to the insulating substrate (for example, a circuit board). There is no particular restriction on the material for the conduction circuit and the electrode forming a part thereof, irrespective of a conductor or a semiconductor, so far as it is conductive. A known conductive metal is preferable. Applicable metals include single metals such as copper, gold, silver, platinum, lead, tin, nickel, iron, cobalt, indium, rhodium, chromium, tungsten, and ruthenium, and alloys containing any of these metals such as a solder, nickel-tin and gold-cobalt. A lamination structure may be formed by using two or more from these metals and alloys. The thickness of the conduction circuit or the electrode forming a part thereof is not limited.

For the formation of the conduction circuit and the electrode forming a part thereof, a method comprises the steps of forming a conductive material layer on the entire surface of the insulating substrate, and removing portions other than a circuit pattern portion to be formed by etching or the like.

No particular limitation is imposed on the diameter of the throughhole for ensuring communication between the electrode forming a part of the conduction circuit and the bump contact. A larger diameter to the extent that the boundary between neighboring throughholes is not broken is preferable because it corresponds to a smaller electric resistance at conducting portions.

The diameter of the throughhole should practically be within a range of from 5 to 200 $\mu$m, or particularly, from 10 to 80 $\mu$m. The throughholes may be formed by any of laser processing, photolithographic processing, chemical etching using a resist having a chemical resistance different from that of the insulating substrate, plasma processing, and mechanical processing such as punching. Among others, laser processing using excimer laser, carbon dioxide gas laser, or YAG laser, which permits fine processing of a throughhole with arbitrary diameter and interhole pitch, is preferable because of the capability to cope with the requirement of fine pitching of the bump contact. The posture of the throughhole relative to the surface of the insulating substrate is not limited to right angles, but the throughhole may be formed so as to be inclined at a prescribed angle to the surface of the insulating substrate. In this event, conduction between the electrode and the bump contact should be ensured in a slightly shifted positional relationship with each other.

The conducting section may be formed in the throughhole to electrically connect the contact to the electrode forming a part of the conduction circuit. The part may be formed either by filling the throughhole with a conductive material, or by depositing a layer of a conductive material on the wall surface of the throughhole as in throughhole plating. The conducting section may be formed by a film forming method such as the electrolytic plating method or the electroless plating method or the CVD process, or a method of mechanically fitting a conductive material into the throughhole. Among others, a method of exposing the electrode forming a part of the conduction circuit in the throughhole, and filling the throughhole with the conductive material by electrolytic plating by using the electrode as a negative pole, since this method ensures electric conduction and is simple.

The basic shape portion of the bump contact may have a convex, concave or any other shape in consideration of the shape of the contact object, irrespective of whether or not it projects from the insulating substrate surface. As in the case of the known bump contact, a smooth hemispherically projecting one is the most useful. The hemispherical shape as used herein is not limited to a perfect hemisphere, but includes projecting shape with a smooth and monotonous curve.

The manufacturing method of the basic shape portion, though not set forth in the invention, should preferably comprise the following steps.

The manufacturing method in the case where the basic shape is of the single-layer structure will be described.

A position where a bump contact is to be formed is determined on the surface of an insulating substrate, and an electrode forming a part of a conduction circuit is formed at a position in the interior or on the back of the substrate corresponding to the determined position. A throughhole is opened at a position where the bump contact is to be formed, and the electrode forming a part of the conduction circuit is exposed on the bottom of this throughhole. The throughhole is opened from the first principal surface of the insulating substrate and reached to the electrode formed on the second principal surface. The throughhole is filled with a conductive material deposited by electroless plating. Such plating is carried out with the electrode given a negative voltage so as to form a conducting section. The deposition is continued by using the same material as this conductive material also for the bump contact. As a result, a smooth hemispherical projection grows from the first principal surface of the insulating substrate and serves as a basic shape portion of the bump contact. In the above-mentioned steps, a concave portion relative to the surface of the insulating substrate may be formed as a basic shape portion by discontinuing deposition prior to filling the throughhole with the conductive material. The basic shape portion should preferably be of a single structure (single-layer structure) by causing deposition of only one material to occur with a view to achieving adhesion between materials and facilitating manufacture.

Then, as shown in FIG. 3, an embodiment in which the basic shape portion has a single-layer structure will be described. The bump contact 2 shown in FIG. 3 comprises the basic shape portion 2a and a surface layer 2e and has a double-layer structure.

As in the known bump contact, the basic shape portion is connected to the electrode via the conducting section, and serves as a core in the surface layer of the bump contact to support the strength of the contact. The basic shape portion should have a hardness within a range from at least 100 to up to 800 Hk (Knoop hardness), or preferably, from 200 to 600 Hk, or more preferably, from 300 to 600 Hk. With a hardness of under 100 Hk, the bump contact tends to deform upon contact with, and pressing against, the contact object. With a hardness of over 800 Hk, cracks tend to easily occur. The material for forming such a basic shape portion is not particularly limited, but an inexpensive conductive metal used for the known bump is preferable, including, for example, nickel, nickel-tin alloy, nickel-palladium, and copper.

The material for forming the basis shape portion should preferably be crystallographically compatible with the material for the conduction circuit, have a high adhesion, and is low in diffusion. When the material for the conduction circuit is copper, nickel or a nickel alloy leads to a preferable combination as a material for the basic shape portion.

The surface convex/concave layer is roughened. It is susceptible to a damage by the repeated contact with the contact object, and is therefore required to have a higher hardness than the contact object. The contact resistance can be kept at a low level by imparting corrosion resistance, and controllability of transfer and diffusion of other metals from the contact object. The surface layer should preferably have a hardness within a range of from at least 800 to up to 1,000 Hk, or more preferably, from 850 to 1,000 Hk, or particularly more preferably, from 900 to 1,000 Hk. With a hardness of under 800 Hk, the convex/concave layer tends to be easily damaged upon contact with the conductor of the DUT. With a hardness of over 1000 Hk, on the other hand, cracks tend to easily occur. Preferable materials for the surface convex/concave layer are corrosion-resistant metals having a property as a barrier preventing metals from transferring and diffusing from the contact object, including such precious metals as rhodium, ruthenium, cobalt, chromium and tungsten.

When using a precious metal for the surface convex/concave layer, the precious metal may be a single metal or an alloy. The content of the precious metal should preferably be at least 99% in consideration of avoiding an increase in contact resistance caused by oxidation of base metals diffusing to the surface, an increase in internal stress caused by organic impurities, and occurrence of cracks. When using an alloy, a combination of precious metals for ensuring corrosion resistance and for reducing diffusion may be, for example, a combination of rhodium and ruthenium. The thickness of surface convex/concave layer should preferably be such that wear resistance of the contact object or electrode in the DUT can be assured.

A multi-layer structure in which an oxidation preventing layer is formed on the surface of the basic shape portion $2a$ can be manufactured only by adding the step of forming the oxidation preventing layer between the formation of the basic shape portion $2a$ and the formation of the surface convex/concave layer. The remaining steps may be the same as those in the above-mentioned manufacturing method. The oxidation preventing layer is helpful to avoid a reduction in adhesion of the surface convex/concave layer (projection) or to suppress variation of the projection shape through oxidation of the basic shape portion. The material for the oxidation preventing layer suffices to be other than the material formed by a strongly acidic plating solution. A strongly acidic plating solution oxidizes the basic shape portion during the step of forming on the surface of the basic shape portion. Available materials may be, for example, gold, silver and palladium which can be plated by the use of weak acid plating solution, neutral plating solution, or alkali plating solution. A thick oxidation preventing layer tends to cause a decrease in adhesion of the projection or variation of the projection shape to occur. The thickness should therefore preferably be within a range of from 0.001 to 0.05 μm, and the forming method includes, for example, strike plating.

EXAMPLES (Probe structure having a single-layer basic shape portion)

Example 1

The present invention will now be described more in detail by means of examples. In this example, the bump contact structure shown schematically in FIG. 3, i.e., a probe structure having a bump contact with a surface-roughened surface layer (convex/concave layer) formed thereon by continuous mat plating (used for wafer-level burn-in test) was actually manufactured. In other words, the illustrated bump contact may be assembled within a semiconductor tester.

Figure 5A:
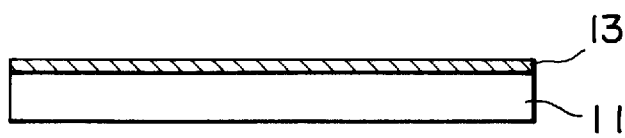
FIGS. 5A to 5C are partial sectional views for describing the manufacturing process of the probe structure of an example of the invention.
Figure 5B:
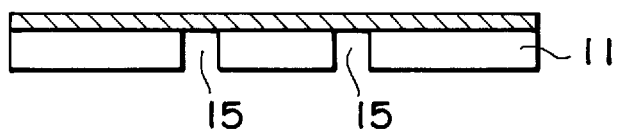

More specifically, as shown in FIG. 5A, use was made of a double-layer film (for example, ESPERFLEX made and sold by Sumitomo Metal Mining Co., Ltd.; polyimide film having a thickness of 25 μm and a copper foil thickness of 16 μm) which has a commercially available polyimide film 11 and copper foil 13 affixed together. Subsequently, a KrF excimer laser (wavelength: 248 nm) was irradiated to a position where a bump contact was to be formed in the polyimide film 11 as shown in FIG. 5B, and a throughhole 15 having an inside diameter of 30 μm was formed. The copper film 13 was exposed on the bottom of this throughhole.

Then, plasma ashing was applied to remove carbon adhering to the polyimide surface upon throughhole processing by excimer laser and improve wettability of the polyimide surface to the plating solution.

Figure 5C:
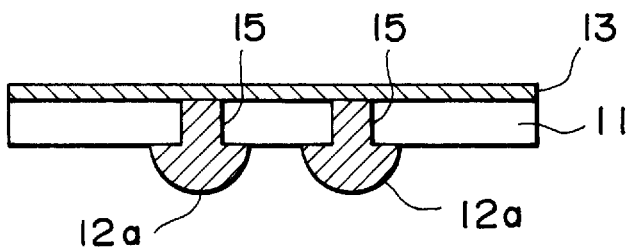

Then, after protecting the copper foil surface on the upper side from being plated, the plating electrode was connected to a part of the copper foil 13, and electro-plating of a nickel alloy was conducted with the copper foil exposed in the throughhole 15 as a negative pole. More specifically, as shown in FIG. 5C, the process comprised the steps of filling the throughhole 15 with deposited nickel alloy, continuing deposition, causing growth to a height projecting by 25 μm from the polyimide surface into a hemispherical single-layer basic shape portion $12a$, transferring this basic shape portion $12a$ made of a nickel alloy to the water rinsing step so as not to allow the basic shape portion $12a$ made of the nickel alloy to come into contact with the atmosphere, water-rinsing the same, then activating the surface of the basic shape portion with a 5% sulfuric acid treatment, water-rinsing the same again, then after water rinsing, setting a plating current density of 0.5 A/dm$^2$, and mat-rhodium-plating while always maintaining a constant plating current density. For a period from plating start of nickel alloy through the end of mat rhodium plating, water rinsing and a pretreatment were carried out without allowing the basic shape portion to come into contact with the atmosphere in succession with no time interval (continuous mat rhodium plating).

The continuous mat rhodium plating deposits a rhodium layer to a thickness of 2 μm. As a result, a surface roughness condition represented by an Rmax of 0.5 μm, an Ra of 0.1 μm and an Rmax/Ra of 5 was obtained. The surface roughness was measured by a probe-based method by measuring an actual bump surface by means of a surface shape measuring device (manufactured by Tencor Instruments Co.: TENCOR P2).

Finally, the copper foil 13 was patterned through etching to form an electric or conduction circuit and an electrode forming a part thereof (not shown), and a probe structure as shown in FIG. 3 was obtained.

Figure 6:
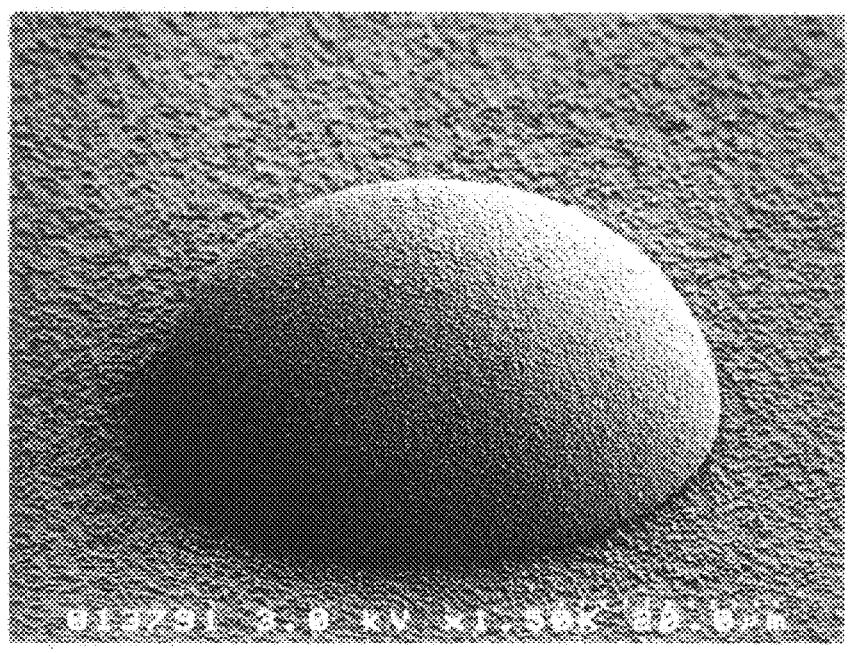
FIG. 6 is an SEM photo of the bump portion in the probe structure manufactured in an example of the invention.
Figure 7:
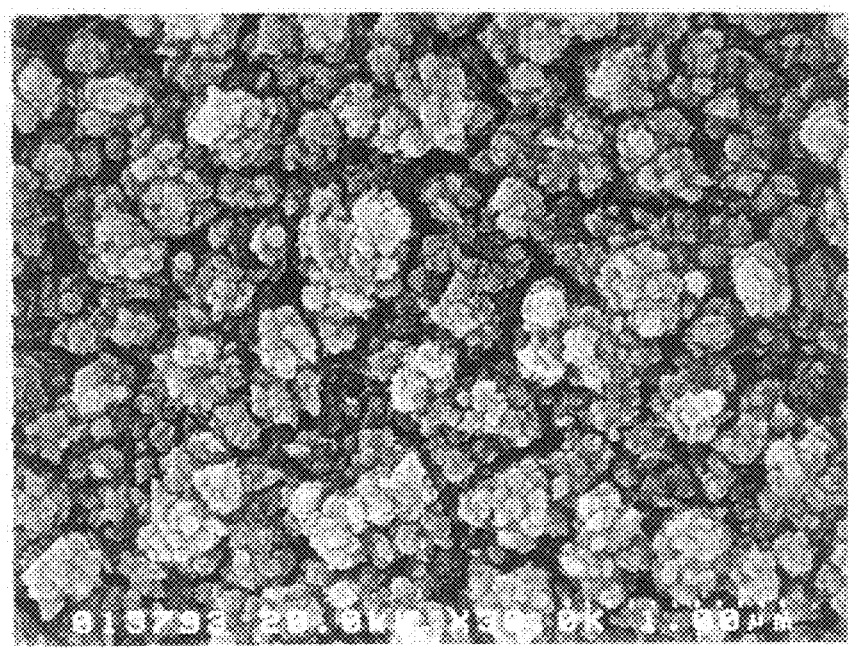
FIG. 7 is an enlarged SEM photo of the bump surface in a probe structure manufactured in an example of the invention.

Observation of the surface condition of the bump contact by an SEM (scanning electron microscope) revealed that, as shown in FIGS. 6 and 7, aggregations of fine grains at random formed convex and concave portions on the surface of the bump contact. A measurement of the grain size gave a size within a range of from 5 to 200 nm, with an average grain size of 80 nm. Each projection formed by aggregations of grains had a size within a range of from about 0.3 to about 0.6 μm, and the projection density was as represented by 1 to 7 grains per μm$^2$. The projections had a thickness within a range of from about 0.1 to about 0.3 μm and a projection pitch within a range of from about 0.25 to about 0.6 μm, suggesting that the projection thickness was about ⅖ to about ½ (at least ⅓) of the projection pitch.

A tape peeling test was carried out by the use of an adhesive tape (for example, one made by Nichiban Co.: CELLOTAPE) showed that the continuous mat rhodium plating layer did not peel off.

The hardness of the basic shape portion made of the nickel alloy and the continuous mat rhodium plating layer was measured by means of a micro-Vickers hardness meter, and this gave a hardness of 600 Hk and 900 Hk, respectively.

Comparative Example 1

After forming a bump contact from a nickel alloy, and leaving the same for ten minutes in the atmosphere, mat rhodium plating was performed (non-continuous mat plating) in the same manner as in Example 1. As a result, the bump contact had a surface roughness as represented by an Rmax of 1.0 μm, an Ra of 0.02 μm and an Rmax/Ra of 50. Analysis of the bump obtained from the non-continuous mat plating permitted confirmation of the presence of an inert condition comprising nickel oxide between the nickel alloy and the rhodium layer. This resulted in variation of adhesion of rhodium grains to the surface of nickel alloy, and Rmax/Ra largely exceeded 10. As a result, the adhesion of the rhodium layer as a whole became poorer. Repetition of contact with the contact object caused occurrence of cracks and chipping of the surface rhodium layer, and this led to a seriously decreased durability. A large height of the projection sometimes led to a thinner projection. Repeated contact between the bump contact and the contact object caused easy peeling from the bump surface and hence a change in contact resistance. It was furthermore difficult to form the product while always keeping constant fine projection height (surface roughness), variation of roughness, and projection density, and the contact resistance dispersed in some cases between bumps.

A tape peeling test carried out with an adhesive tape (for example, made by Nichiban Co.: CELLOTAPE) showed easy peeling of the rhodium layer.

Examples 2 to 5 and 8 to 10, and Comparative Examples 2 to 5

A probe structure having bump contacts of which the surface roughness was different from each other was prepared in the same manner as in Example 1, except that the plating current density and the amount of glossing agent were appropriately adjusted in the continuous mat rhodium plating step. Measurement of the bump surface roughness, Rmax/Ra and grain size gave results as shown in Table 1.

TABLE 1

|  | Rmax ($\mu$m) | Ra ($\mu$m) | Rmax/Ra | Grain Size (nm) |
| --- | --- | --- | --- | --- |
| Example 2 | 0.01 | 0.0012 | 8.33 | 5–100 |
| Example 3 | 0.8 | 0.13 | 6.15 | 10–200 |
| Example 4 | 0.01 | 0.001 | 10.0 | 5–100 |
| Example 5 | 0.8 | 0.4 | 2.0 | 10–200 |
| Example 8 | 0.12 | 0.05 | 2.4 | 5–200 |
| Example 9 | 0.3 | 0.07 | 4.29 | 5–200 |
| Example 10 | 0.5 | 0.2 | 2.5 | 5–200 |
| Comparative Example 2 | 0.01 | 0.0007 | 14.3 | 5–100 |
| Comparative Example 3 | 0.82 | 0.02 | 41 | 10–200 |
| Comparative Example 4 | 0.009 | 0.0008 | 11.3 | 5–100 |
| Comparative Example 5 | 0.8 | 0.42 | 1.9 | 15–200 |

Examples 6 and 7 and Comparative Examples 6 and 7

Probe structures were prepared in the same manner as in Example 1 except the plating current density was set at 0.1 A/dm$^2$ (Example 6), 1.0 A/dm$^2$ (Example 7), 0.05 A/dm$^2$ (Comparative Example 6), and 1.5 A/dm$^2$ (Comparative Example 7). Measured results of surface roughness, Rmax/Ra and grain size were as shown in Table 2.

TABLE 2

|  | Rmax ($\mu$m) | Ra ($\mu$m) | Rmax/Ra | Grain Size (nm) |
| --- | --- | --- | --- | --- |
| Example 6 | 0.01 | 0.005 | 2.0 | 5–100 |
| Example 7 | 0.8 | 0.09 | 8.8 | 10–200 |

TABLE 2-continued

|  | Rmax ($\mu$m) | Ra ($\mu$m) | Rmax/Ra | Grain Size (nm) |
| --- | --- | --- | --- | --- |
| Comparative Example 6 | 0.004 | 0.001 | 4.0 | 5–200 |
| Comparative Example 7 | 1.5 | 0.06 | 25.0 | 10–200 |

Evaluation of Contact Condition

An aluminum chip comprising a glass substrate and an aluminum layer vapor-deposited thereon into a thickness of 1 $\mu$m was used as an contact object, and the contact condition of probe structures having different values of surface roughness as above was evaluated. When the surface layer formed by continuous mat rhodium plating had a surface roughness as represented by an Rmax within a range of from 0.01 to 0.8 $\mu$m, an Ra within a range of from 0.001 to 0.4 $\mu$m, and an Rmax/Ra within a range of from 2 to 10 (Examples 1 to 10), the aluminum oxide film was appropriately broken. Under a load of 1.0 g per bump, a low contact resistance of up to 1 Ω was obtained, and contribution to stabilization of contact resistance could be confirmed.

Figure 8:
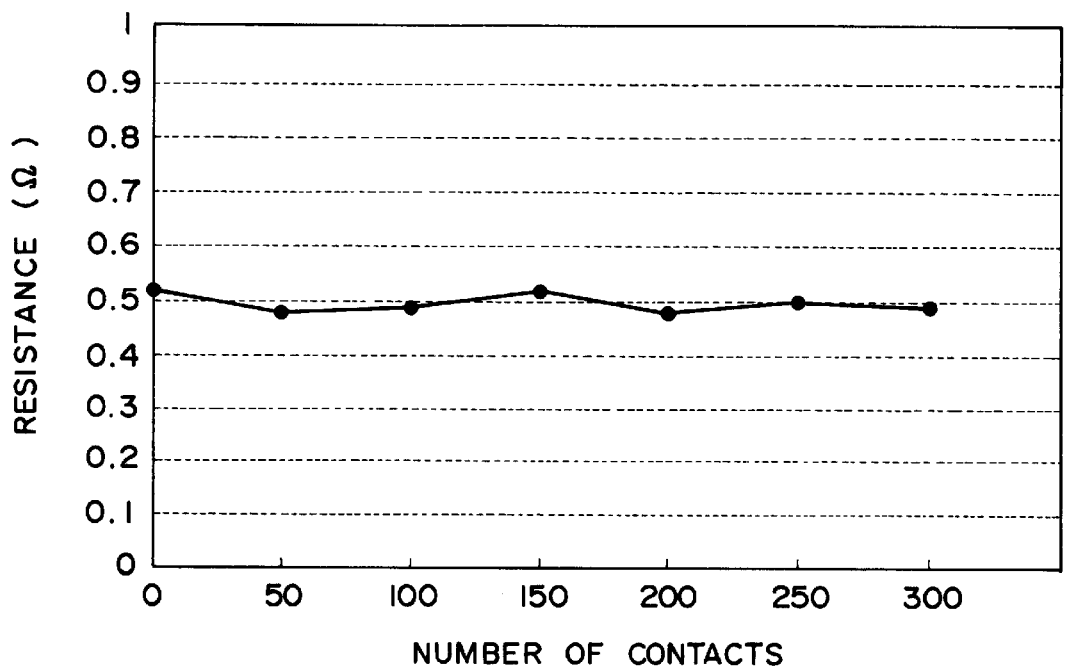
FIG. 8 illustrates the relationship between resistance and the number of contacts in a probe structure manufactured in an example of the invention.

As a result of evaluation of 300 times under a load of 10 g against the contact object, the bump contacts on which the rhodium layer was formed by non-continuous mat plating showed cracks and chipping of the rhodium layer after only one to two runs of contact. In the samples in which a rhodium layer was formed by continuous mat plating, and no decrease in contact resistance was observed (FIG. 8). The surface condition of the bump contacts in which no cracks or chipping were caused by the repetition of contact was observed through a microscope for evaluation. When the surface layer formed by continuous mat plating had a surface roughness as represented by an Rmax within a range of from 0.01 to 0.8 $\mu$m, an Ra within a range of from 0.001 to 0.4 $\mu$m, and an Rmax/Ra within a range of from 2 to 10 (Examples 1 to 10), the projections of the surface layer showed no deterioration.

Using the probe structures obtained in the above-mentioned Examples 1 to 10, a contact repeating test on the aluminum chip was carried out. The result revealed that wear and chipping of the surface were far slighter than in the conventional art, and a highly reliable contact condition could be kept for a longer period of time.

In Comparative Examples 3, 5 and 7, on the other hand, the large surface roughness caused penetration through the aluminum film which was the DUT, and damaged the electrode. In Comparative Examples 2, 4, 3, and 7, the large variation of the surface roughness (Rmax/Ra) caused chipping of the projections at high portions and other deterioration after repetition of contact. Especially, it was observed in Comparative Examples 3 and 7 that a lot of projections were chipped off.

In Comparative Examples 2, 4 and 6 in which the surface roughness was low, bringing the bump into contact with the DUT gave only a limited effect of breaking through the metal oxide film, and variation of contact resistance between different bump contacts was produced.

In Comparative Examples 6 and 7, in which plating was carried out with a current density largely deviating from an appropriate current density for rhodium plating, deposition of rhodium was not stabilized, and grains grew larger in size to over 200 nm at portions other than the points where surface roughness had been measured, resulting in a very large surface roughness. Thus, bumps suffered from abnormal deposition of plating film.

Comparative Example 8

Figure 1:
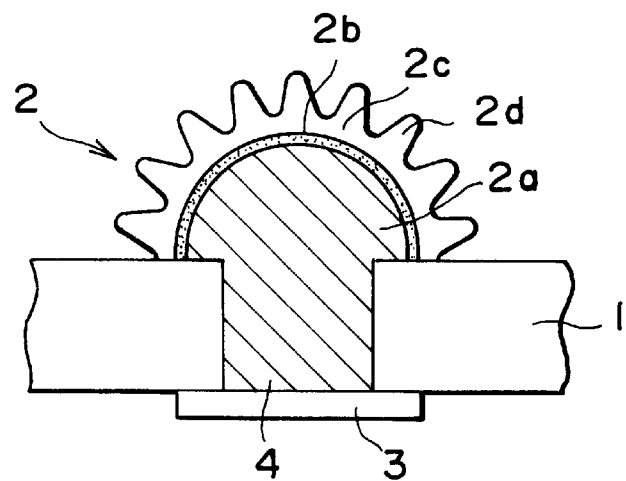
FIG. 1 is a partial sectional view for describing a conventional probe structure.
Figure 2:
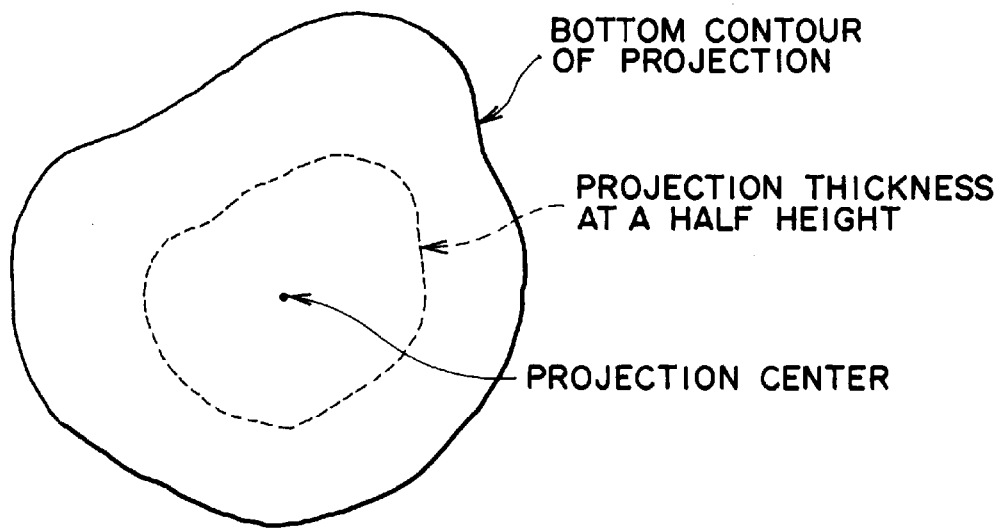
FIG. 2 illustrates the projection thickness of the surface condition of the lump contact.

Current density was varied upon carrying out continuous mat rhodium plating, and a probe structure having a bump contact shown in FIG. 1 was obtained.

As a result, it was ascertained that varying the current density during plating caused an unstable current density and produced variation of the projection shape.

Comparative Example 9

A probe structure was prepared in the same manner as in Example 1 or Comparative Example 1 except that an intermediate layer (1 μm) comprising a gold plating layer was provided on the surface of the basic shape portion made of nickel alloy, and continuous or no-continuous mat rhodium plating was applied to the surface thereof.

As a result, the rhodium plating showed a low adhesion and peeled off (multi-layer probe structure in which an oxidation preventing layer was formed on the surface of the basic shape portion).

Example 11

A probe structure (applicable for burn-in test purposes) was manufactured in the same manner as in Example 1 except that, after forming a basic shape portion 12a as in Example 1, an oxidation preventing layer was provided by Au (gold) strike plating carried out by the use of weak acid Au (gold) plating bath. The Au strike plating conditions included a film thickness of up to 0.05 μm. As a result, aggregation of randomly formed fine grains formed irregularities on the surface of the bump contact. The surface roughness was represented by an Rmax of 0.4 μm, an Ra of 0.1 μm, and an Rmax/Ra of 4, with grain sizes ranging from 10 to 150 nm and an average grain size of about 100 nm. A tape peeling test was carried out by use of an adhesive tape (for example, made by Nichiban Co.: CELLOTAPE). The continuous mat rhodium plating layer did not peel off. In an evaluation test conducted on the same contact condition as above (evaluation on repetition of 300 runs under a load of 10 g on the contact object), resistance was constant at about 0.45 Ω.

Example 12

Figure 9:
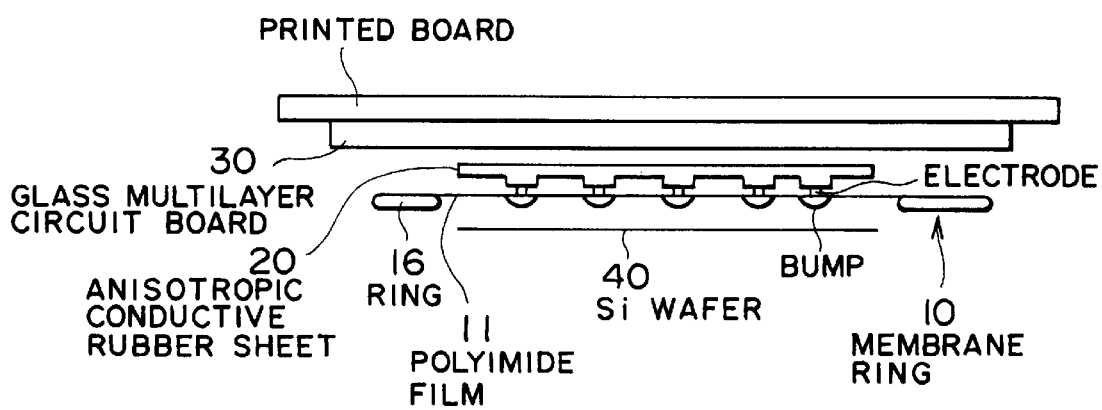
FIG. 9 is a schematic view for describing a burn-in test in an example of the invention.

A burn-in test (Japanese Unexamined Patent Application Publication No. 7-231019) was carried out by the use of a wafer-level burn-in tester as illustrated in FIG. 9. Specifically, the tester is manufactured by preparing a membrane ring 10 having a probe structure which may be similar to that shown in the above-mentioned example and which is formed on a polyimide film 11 deployed within the ring 10 and supported on a ring 16, as shown in FIG. 9. On testing an Si wafer 40 placed on a vacuum chuck (not shown), the membrane ring 10, an anisotropic conductive rubber sheet 20, and a glass multi-layer circuit board 30 were arranged in this order on the Si wafer 40 (having an electrode pad made of aluminum). Under the circumstances, the entire assembly was sucked and fixed and all the devices on the wafer 40 were connected to the glass multi-layer circuit board 30 via a print board to a test machine. The burn-in test was carried out by increasing the temperature from the room temperature to a set temperature within a range of from 80 to 150° C.

It is to be noted that the illustrated multi-layer circuit board 30 had an insulating layer and a plurality of conductive patterns which were formed on front and rear surfaces of the insulator layer and which were electrically connected to each other through contact holes opened at the insulating layer.

As a result, the bump made of nickel alloy having a continuous mat rhodium plating layer, manufactured by the manufacturing method of the example had a low contact resistance from the initial stage of contact, and the low contact resistance was maintained after the lapse of a period of time even in a heated state. The continuous mat rhodium plating produced a strong adhesion of the projections. The projections were excellent in strength, hardly suffered deterioration from repeated contact, and were free from variation of contact resistance between different bump contacts.

The bump comprising nickel alloy tended in contrast to show a decrease in contact resistance upon the lapse of time in a heated state.

The bump that was made of nickel alloy having a gold plating film (thickness: 1 μm) (Comparative Example 9) had a low contact resistance at the beginning of contact, but tended to exhibit an increase in contact resistance with time in a heated state.

The bump prepared by providing an intermediate layer (thickness: 1 μm) comprising a gold plating film on the surface of a bump made of nickel alloy, and applying continuous or non-continuous mat rhodium plating to the surface thereof showed a poor adhesion of rhodium which peeled off.

These findings suggest that the bump prepared by applying continuous mat rhodium plating to the surface of a bump made of nickel alloy is suitable for use for burn-in test purposes.

The present invention is not limited to the aforementioned examples.

For example, a buffer layer serving to absorb and alleviate the stress produced in the contact by a contact pressure upon pressurizing the surface layer upon inspection may be provided between the basic shape portion and the surface layer having a prescribed surface roughness. Applicable materials for the buffer layer include gold, palladium, silver, indium and platinum. It is however necessary to pay attention to peeling and variation of surface irregularities.

The roughness of the bump surface can be appropriately set by varying the electrode pad or the circuit pattern, in consideration of the thickness of the contact object on the DUT or the thickness of the oxide film on the conductor surface.

The prescribed roughness of the bump surface may be achieved by any method other than the appropriate adjustment of the plating current density or the amount of the glossing agent as in the above-mentioned examples. Applicable methods include, for example, a method of dispersing fine particles of diamond or the like in the basic shape portion or the surface layer and forming irregularities (projections) in the surface layer at the contact portion, a method of dispersing such fine particles, then, removing the fine particles in the proximity of the surface through etching or the like, and forming irregularities (projections) in the surface layer at the contact portion, and a method of mechanically forming irregularities by bringing the contact portion of the surface layer into contact with a material having a rough surface or with fine particles of powder.

According to the present invention, it is possible to provide a probe structure having excellent properties, of which the projection shape is within an appropriate range, and a manufacturing method thereof.

According to the invention, furthermore, it is possible to provide a probe structure in which the projections have a strong adhesion and are excellent in strength, which suffers from only slight deterioration even after repetition of contact, of which the contact resistance does not disperse between bump contacts, and which permits easy manufacture, and a manufacturing method thereof.

Although description has thus far been made about the case where the probe structure according to the invention is used for the wafer-level burn-in test, the probe structure according to the invention may be used for testing a chip size package (CSP), or as a tape carrier for a chip-level burn-in test, a burn-in probe card, a membrane probe card.

What is claimed is:

1. A probe structure which comprises an insulating substrate having first and second principal surfaces, a bump contact protruded from the first principal surface, and an electrode electrically connected to the bump contact and operable as a part of an electrical circuit formed on the second principal surface and/or an inner side of the insulating substrate, wherein:

said bump contact has a surface roughness which is specified by Rmax within a range from 0.01 to 0.8 $\mu$m, Ra within a range from 0.001 to 0.4 $\mu$m, and a ratio of Rmax/Ra within a range from 2 to 10.

2. A probe structure according to claim 1, wherein said bump contact has, on its surface, a plurality of projections which define said surface roughness and which have a projection spacing within a range from 0.1 to 0.8 $\mu$m, and a projection thickness which is not smaller than one third of the projection spacing.

* * * * *